(12) United States Patent
Monestier et al.

(10) Patent No.: US 11,075,191 B2
(45) Date of Patent: Jul. 27, 2021

(54) FLEXIBLE LED LIGHTING STRIP WITH HOMOGENEOUS FLEXIBILITY

(71) Applicant: Lumileds LLC, San Jose, CA (US)

(72) Inventors: Florent Monestier, Kerkrade (NL); Christian Kleijnen, Ell (NL)

(73) Assignee: LUMILEDS LLC, San Jose, CA (US)

(\*) Notice: Subject to any disclaimer, the term of this patent is extended or adjusted under 35 U.S.C. 154(b) by 0 days.

(21) Appl. No.: 16/294,596

(22) Filed: Mar. 6, 2019

(65) Prior Publication Data

US 2019/0277462 A1    Sep. 12, 2019

(30) Foreign Application Priority Data

Mar. 8, 2018   (EP) .................................... 18160642

(51) Int. Cl.
  *F21V 21/005*   (2006.01)
  *H01L 25/075*   (2006.01)
  (Continued)

(52) U.S. Cl.
  CPC .............. *H01L 25/075* (2013.01); *F21S 4/22* (2016.01); *F21S 4/24* (2016.01); *F21S 41/141* (2018.01);
  (Continued)

(58) Field of Classification Search
  CPC ......... H01L 25/075; F21S 4/22; F21S 41/141; F21S 4/24; F21S 43/15; F21S 41/151;
  (Continued)

(56) References Cited

U.S. PATENT DOCUMENTS

| 3,633,023 A | 1/1972 | Castiglioni et al. |
| 4,413,311 A | 11/1983 | Orenstein |
| (Continued) | | |

FOREIGN PATENT DOCUMENTS

| EP | 3081845 A1 | 10/2016 | |
| EP | 3136829 A1 | 3/2017 | |
| NL | WO-2017157753 A1 * | 9/2017 | ............. H01L 33/56 |

OTHER PUBLICATIONS

International Preliminary Report on Patentability dated Sep. 8, 2020 for PCT International Application No. PCT/EP2019/054842.
(Continued)

*Primary Examiner* — Donald L Raleigh
(74) *Attorney, Agent, or Firm* — Volpe Koenig (57) ABSTRACT

A flexible lighting strip comprises a multitude of light-emitting diodes (LEDs) and is arranged to bend around at least two, preferably three, linear independent axes. The LEDs are arranged in at least two groups, wherein each group comprises at least two LEDs arranged in an electrical series connection. The groups are arranged in an electrical parallel connection to an anode and cathode track. The groups are arranged in a longitudinal arrangement such that a last LED of a first group is arranged next to the first LED of a second group, and are mechanically coupled via an electrically isolated coupling structure such that a stiffness of the flexible lighting strip between the last LED of the first group and the first LED of the second group is matched to a mechanical stiffness between neighboring LEDs comprised by one of the first or second.

16 Claims, 11 Drawing Sheets

(51) Int. Cl.

| | | |
|---|---|---|
| | *F21S 4/24* | (2016.01) |
| | *F21S 41/141* | (2018.01) |
| | *F21V 23/06* | (2006.01) |
| | *F21V 23/00* | (2015.01) |
| | *F21S 4/22* | (2016.01) |
| | *H05B 45/00* | (2020.01) |
| | *F21Y 103/10* | (2016.01) |
| | *F21Y 115/10* | (2016.01) |
| | *F21S 41/151* | (2018.01) |
| | *F21S 43/15* | (2018.01) |

(52) U.S. Cl.
CPC .......... *F21V 21/005* (2013.01); *F21V 23/001* (2013.01); *F21V 23/06* (2013.01); *H05B 45/00* (2020.01); *F21S 41/151* (2018.01); *F21S 43/15* (2018.01); *F21Y 2103/10* (2016.08); *F21Y 2115/10* (2016.08)

(58) Field of Classification Search
CPC ...... F21V 23/001; F21V 23/06; F21V 21/005; H05B 33/0803; F21Y 2115/10; F21Y 2103/10
See application file for complete search history.

(56) References Cited

U.S. PATENT DOCUMENTS

| | | | |
|---|---|---|---|
| 6,447,106 B1* | 9/2002 | Watanabe | ............ B41J 2/14233 347/70 |
| 10,203,075 B1 | 2/2019 | Kim | |
| 2009/0296380 A1 | 12/2009 | Shen et al. | |
| 2009/0296382 A1 | 12/2009 | Maier | |
| 2010/0164409 A1* | 7/2010 | Lo | ........................ H05B 45/00 315/312 |
| 2012/0075871 A1 | 3/2012 | Chen | |
| 2012/0256813 A1 | 10/2012 | Kostka et al. | |
| 2014/0062316 A1 | 3/2014 | Tischler et al. | |
| 2014/0268780 A1 | 9/2014 | Wang et al. | |
| 2015/0167910 A1* | 6/2015 | Stoyan | .................... F21S 2/005 29/25.01 |
| 2015/0308632 A1 | 10/2015 | Ueno et al. | |
| 2015/0338080 A1 | 11/2015 | Dexter et al. | |
| 2016/0332018 A1 | 11/2016 | Granat et al. | |
| 2017/0356635 A1 | 12/2017 | Zawacki et al. | |
| 2018/0178422 A1* | 6/2018 | Harrison | ............... F21V 15/012 |
| 2019/0051803 A1* | 2/2019 | Kums | ............... H01L 23/49541 |

OTHER PUBLICATIONS

International Search Report dated Sep. 12, 2019 for PCT International Application No. PCT/EP2019/054842.
International Preliminary Report on Patentability dated Sep. 8, 2020 for PCT International Application No. PCT/EP2019/054882.
International Search Report dated Sep. 12, 2019 for PCT International Application No. PCT/EP2019/054882.
Extended European Search Report dated Jul. 12, 2019 for European Patent Application No. 18202570.0.
Extended European Search Report dated Jul. 9, 2019 for European Patent Application No. 18160642.7.

* cited by examiner

FLEXIBLE LED LIGHTING STRIP WITH HOMOGENEOUS FLEXIBILITY

CROSS REFERENCE TO RELATED APPLICATION

This application is related to U.S. application Ser. No. 16/294,424, filed Mar. 6, 2019.

FIELD OF INVENTION

The invention relates to a flexible lighting strip comprising a multitude of light-emitting diodes in a longitudinal arrangement. The invention further relates to a light assembly comprising such a flexible lighting strip. The invention finally relates to a vehicle rear light or vehicle front light comprising such a vehicle light assembly.

BACKGROUND

Flexible LED bands are used for an ever-increasing number of lighting applications. In many cases, an optical element is arranged in front of an LED to alter the light emission, such as e.g. a lens, a reflector and/or a collimator and/or light guide to obtain an emitted light beam of desired properties. Bendability or conformability of the LED band allows fitting in a corresponding application as, for example, vehicle light assemblies which are integrated in curvy automobile body frames. Reliability of the flexible LED band is a key feature especially for automotive applications.

US 2009/0296382 A1 discloses, for example, a flexible LED band. The flexible LED band has a basis for attaching the flexible LED band and at least partially light-transmissive covering connectable to the basis, wherein in a state connected to each other the basis and the covering form an accommodation cavity for the flexible LED band.

EP 3 081 845 A1 discloses a support structure for lighting devices that includes a ribbon-like support member with electrically conductive lines with mounting locations for electrically powered light radiation sources.

US 2014/0062316 A1 discloses a lighting system with one or more lightsheets each including a plurality of strings of light-emitting elements, control elements, and power conductors.

US 2012/0256813 A1 relates to a lighting assembly having a generally planar, light source including a perimeter edge. A backsheet is disposed in substantially parallel relation with the light source.

SUMMARY

It is an object of the present invention to provide a flexible lighting strip comprising a multitude of LEDs with improved reliability.

The invention is defined by the independent claims. The dependent claims define advantageous embodiments.

According to a first aspect a flexible lighting strip comprising a multitude of light-emitting diodes is provided. The flexible lighting strip is arranged to be bended around at least two, more preferably three linear independent axes. The light-emitting diodes are arranged in at least two groups. Each group comprises at least two light-emitting diodes arranged in an electrical series connection. The at least two groups are arranged in an electrical parallel connection to an anode track and a cathode track. The at least two groups are arranged in a longitudinal arrangement such that a last light-emitting diode of a first group is arranged next to a first light-emitting diode of a second group. The last light-emitting diode of the first group is mechanically coupled by means of a coupling structure to the first light-emitting diode of the second group such that a stiffness of the flexible lighting strip in-between the last light-emitting diode of the first group and the first light-emitting diode of the second group is matched to a mechanical stiffness between neighboring LEDs comprised by the first group (or the second group). The coupling structure is arranged to match the stiffness strip in-between the last light-emitting diode of the first group and the first light-emitting diode of the second group to the additional stiffness caused by the electrical series connection in-between two LEDs comprised by one of the first group and/or the second group. The coupling structure increases uniformity or homogeneity of stiffness of the flexible lighting strip along the longitudinal extension of the flexible lighting strip. The coupling structure is arranged to locally increase the stiffness between neighboring groups of LEDs, wherein each group comprises two, three, four or more LEDs which are arranged in an electrical series connection. The coupling structure may comprise a material with a Young's modulus greater than 1 GPa, preferably greater than 10 GPa. The coupling structure is electrically isolated with respect to the anode track and the cathode track or comprises an electrically isolating material such that an electrical connection between the anode track and the cathode track by means of the coupling structure is avoided.

A multitude of LEDs are distributed regularly over the length of the flexible lighting strip. The number of LEDs determines the driving voltage in case of a mere serial connection and determines the driving current in case of the mere parallel connection. Serial connection allows arrangement of the LEDs in a row with high aspect ratio between length and width. On the other hand, parallel connection may be needed to prevent the voltage of the device to be too high and to fit the typical output voltage range delivered by, for example, an automotive power supply. The best compromise between low current and low-voltage is to use many groups of LEDs which are connected in series and connect the groups in parallel. The wiring needed to connect the groups of LEDs in parallel connection and the serial connection within the group influences stiffness of the lighting strip. The stiffness would be non-uniform along the flexible lighting strip (see FIGS. 1-5 for details).

The flexible lighting strip may especially be useful in automotive applications. In the automotive industry, light sources like the lighting strip are often combined with flexible large surface diffusor allowing spreading the light and patterning the light essentially without limitations. The light guide is an important component because it controls the final optical properties and appearance of the emitted light. Moreover, it happens that for cost reduction, the light guide is also used to hold different parts together. The most common light guides are made of silicone material (maximum Young's modulus around 0.05 GPa) because it is cheap, easy to process and optically transparent. Silicone (or any material with the previous features listed) is characterized by a very high coefficient of thermal of expansion (CTE) which means that if temperature varies, the material expands or shrinks strongly.

Automotive validation of components like the flexible lighting strip requires passing, for example, thermal cycling tests. Experiments have shown that the coupling structure between neighboring groups avoids critical local bending of the LED strip which may be caused by the thermal load during the thermal cycling test, the CTE mismatch between the silicone light guide and the wiring and the variation of the stiffness caused by the wiring in view of the electrical boundary conditions. The coupling structure increases reliability of the flexible lighting strip such that automotive validation tests can be passed.

The electrically isolated coupling structure is arranged to avoid electrical short circuits between the anode track and the cathode track. The light emitting diodes may be arranged in two, three, four or more groups. The anode track and cathode track may comprise a spring structure (e.g. curved or coiled arrangement of wires or conductive tracks) to support flexibility of the flexible lighting strip. The anode track and cathode track may be arranged in a common plane parallel to the light-emitting diodes or may partly extend perpendicular to a plane defined by light emission surfaces of the light-emitting diodes.

The coupling structure may comprise a spring structure as described above to support flexibility of the flexible lighting strip.

The coupling structure may be arranged on the neutral axis of the flexible lighting strip so that it does not extend or shorten during bending. The additional mechanical coupling between the groups of LEDs would in this case have no negative impact on bending even if the coupling structure does not comprise a spring structure like the anode track and the cathode track.

The flexible lighting strip provides an elongate arrangement of LEDs which may be deformed into a desired 3D configuration. In this way, a standard component which may be mass produced may be used for multiple different applications, thereby reducing manufacturing costs.

The flexible lighting strip is arranged to be bended around at least two linear independent axes, preferably three linear independent axes (e.g. axes of a Cartesian coordinate system).

A mechanical coupling between the coupling structure and the anode track and the cathode track may be dominated by a mechanical coupling of the coupling structure to the last light-emitting diode of the first group and the first light-emitting diode of the second group. It may be desirable that the stiffness of the flexible lighting strip may essentially be determined by the electrical interconnections which are needed to connect the LEDs to avoid any unnecessary limitation with respect to the flexibility of the flexible lighting strip. The mechanical coupling between the LEDs may therefore be governed by the flexibility limitations imposed by the electrical connections between the LEDs.

The anode track, the cathode track and the coupling structure may, for example, be arranged such that a relative movement between the anode track, the cathode track and the coupling structure is enabled when the flexible lighting strip is bended. The cathode track, anode track and the series connection within the groups of LEDs may therefore be arranged as independent wire structures which are mechanically coupled via the LEDs or any carrier structure on which one or more LED may be mounted. The coupling structure is arranged to provide a local mechanical coupling between two neighboring LEDs.

The anode track and the cathode track may be symmetrically arranged with respect to the coupling structure along a longitudinal extension of the coupling structure. The coupling structure may, for example, be comprised by a plane of symmetry such that the cathode track is arranged mirror-symmetrically with respect to the anode track. The cathode track and the anode track may alternatively be arranged in a spiral arrangement around the coupling structure such that corresponding points of the cathode track and the anode track are arranged at the same distance with respect to the coupling structure if they are connected by a straight line which is perpendicular to the coupling structure. The anode track and the coupling structure or the cathode track and the coupling structure may in an alternative embodiment be arranged symmetrically with respect to the longitudinal extension of the cathode track or the anode track. The symmetrical arrangement may support homogeneous flexibility and especially homogeneous three-dimensional flexibility along the longitudinal extension of the flexible lighting strip.

The coupling structure may be arranged such that the stiffness of the flexible lighting strip between the last light-emitting diode of the first group and the first light-emitting diode of the second group is at least the same as a stiffness between two neighboring light-emitting diodes which are arranged in the electrical series connection. The coupling structure may be arranged such that the stiffness between the groups of light-emitting diodes and the stiffness within each group of light-emitting diodes is essentially the same. An essentially homogeneous stiffness may increase reliability because the mechanical stress during thermally or mechanically induced bending is homogeneously distributed along the flexible lighting strip.

The coupling structure may alternatively be used to design local flexibility in accordance with the intended application (e.g. local curvature of a body of a vehicle). The stiffness of the coupling structure may therefore vary within certain limits across the longitudinal extension of the flexible lighting strip.

The coupling structure may comprise or consist of the same material as an electrical connection or connector providing the series connection between two neighboring light-emitting diodes which are arranged in the electrical series connection. Using the same material as used for the series connection may simplify design of a flexible lighting strip with essentially homogeneous stiffness along the longitudinal extension of the flexible lighting strip.

The coupling structure may be arranged to provide an electrically conductive path between the last light-emitting diode of the first group and the first light-emitting diode of the second group. The electrically conductive path may be used to transmit control signals or measurement data (e.g. local temperature).

The coupling structure may be arranged to provide a data connection between the last light-emitting diode of the first group and the first light-emitting diode of the second group. The data connection may be based on electrical signals (see above) or optical signals (e.g. light guide).

The flexible lighting strip may be arranged such that each light-emitting diode is attached to a single interposer or carrier structure. The interposer may comprise an anode contact, a cathode contact and a coupling pad. The coupling pad is electrically isolated with respect to the anode contact and the cathode contact. One anode contact of each group of light-emitting diodes is electrically connected to the anode track. One cathode contact of each group light-emitting diodes is electrically connected to the cathode track. The coupling structure is bonded to the coupling pad of the interposer attached to the last light-emitting diode of the first group and to the coupling pad of the interposer attached to the first light-emitting diode of the second group. One anode contact of each group of light-emitting diodes may be electrically connected to the anode track by means of an anode interconnect. One cathode contact of each group light-emitting diodes may be electrically connected to the cathode track by means of an cathode interconnect.

The flexible lighting strip according to any embodiment described above may be embedded in a translucent material. The translucent material may, for example, be a silicone polymer. The translucent material may be arranged to enable a homogeneous illumination during operation of the flexible lighting strip. The translucent material may, for example, comprise scattering particles or structures to support homogeneous light distribution along the extension of the flexible lighting strip or wavy embossment. The scattering particles or structures may be arranged to mask positions of the light-emitting diodes within the flexible lighting strip during operation of the flexible lighting strip.

The translucent material may, for example, be comprised by a light guiding structure. The light guiding structure may be framed by a frame structure such that emitted light emitted by the light-emitting diodes during operation of the flexible lighting strip leaves the light guiding structure via an opening of the frame structure. The frame structure may be arranged to reflect and redistribute light guided within the light guiding structure. The frame structure may especially comprise diffusely reflective surfaces supporting homogeneous light distribution during operation of the flexible lighting strip.

The coupling structure may be arranged to dissipate heat generated by the LEDs during operation of the flexible lighting strip. The coupling interface may be coupled to a heat distribution structure. The heat distribution structure may be a separate foil or wire comprising a material with sufficient heat conductivity. The heat distribution structure may alternatively be comprised by the frame structure. The coupling structure may, for example, comprise a coupling interface. The coupling interface approaches the frame structure. The coupling interface may extend perpendicular to a plane defined by the light emitting diodes within the flexible lighting strip. The coupling interface may be attached to or bonded to the heat distribution structure to dissipate the generated heat. The heat distribution structure may be arranged to reflect especially diffusely reflect light emitted by the light-emitting diodes. The heat distribution structure may, for example, comprise a metal wire or foil covered with a diffusely reflective coating.

The coupling interface may alternatively or in addition be arranged to provide a data connection to the last light-emitting diode of the first group or the first light-emitting diode of the second group. The data connection may be performed by means of electrical signals distributed via the heat distribution structure. The coupling interfaces may alternatively be connected to a data track such that data related to the different groups of light-emitting diodes can be submitted to or read out via the data track. The data track may be arranged to transmit electrical or optical data signals.

According to a further aspect a vehicle light assembly is provided. The vehicle light assembly comprises the flexible lighting strip according to any embodiment described above. The vehicle light assembly comprises an electrical interface. The electrical interface is arranged to couple the vehicle light assembly to an external power supply.

A vehicle rear light or vehicle front light may comprise the vehicle light assembly in accordance with any embodiment described above.

The vehicle light assembly may, for example, be used in daytime running light (DRL), tail light, stop light or turn light.

It shall be understood that a preferred embodiment of the invention can also be any combination of the dependent claims with the respective independent claim.

Further advantageous embodiments are defined below.

BRIEF DESCRIPTION OF THE DRAWINGS

These and other aspects of the invention will be apparent from and elucidated with reference to the embodiments described hereinafter.

The invention will now be described, by way of example, based on embodiments with reference to the accompanying drawings.

In the drawings:

FIGS. 11-13 show different embodiments of interposers In the Figures, like numbers refer to like objects throughout. Objects in the FIGS. are not necessarily drawn to scale.

DETAILED DESCRIPTION OF THE PREFERRED EMBODIMENTS

Various embodiments of the invention will now be described by means of the Figures.

Figure 1:
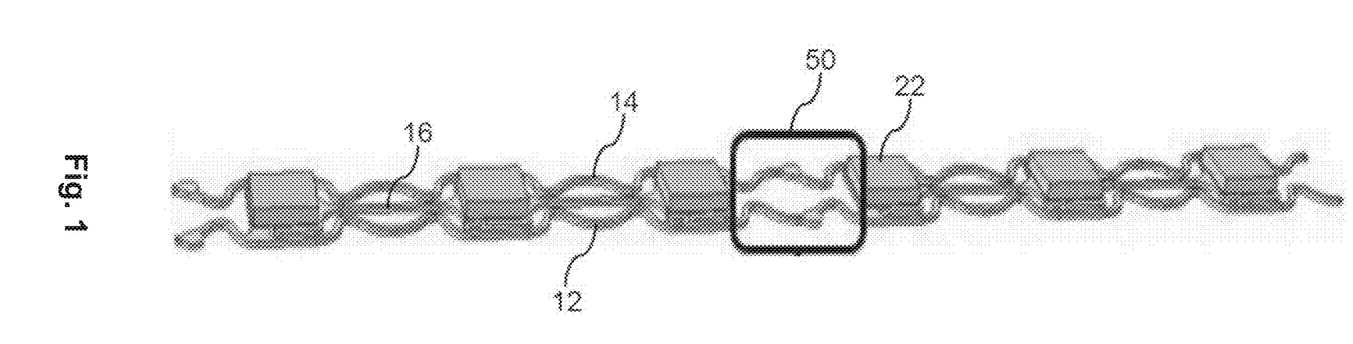
FIG. 1 shows a principal sketch of a lighting strip
Figure 4:
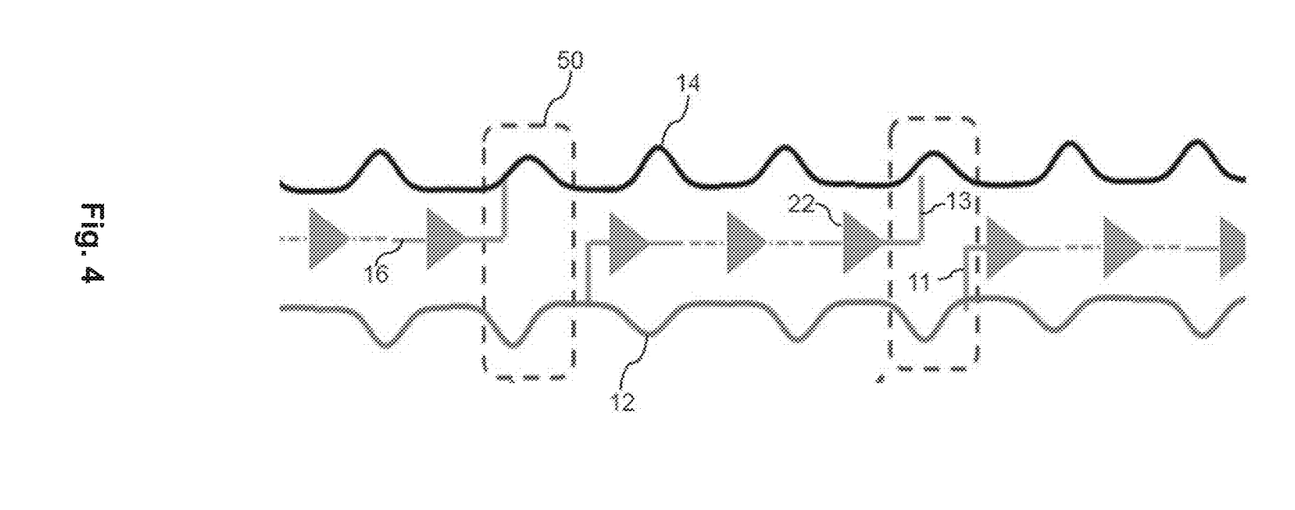
FIG. 4 shows a principal sketch of the electrical connection of a lighting strip

FIG. 1 shows a principal sketch of a lighting strip which was investigated within the framework of the work leading to the present invention. The lighting strip comprises a multitude of LEDs 22 arranged in the longitudinal arrangement. Two groups of LEDs 22 are shown which are connected by means of a coupling area 50. The LEDs 22 of each group of LEDs are arranged in an electrical series connection 16. The electrical series connection 16 is enabled by means of electrically conductive path or wire arranged between neighboring LEDs 22 comprised by the respective group of LEDs 22. The groups of LEDs 22 are arranged in an electrical parallel connection wherein each group is electrically connected to an anode track 12 and cathode track 14. FIG. 4 shows a principal sketch of the electrical connection of such a lighting strip. Groups of three LEDs 22 which are arranged in an electrical series connection 16 are electrically connected to the anode track 12 by means of an anode interconnect 11 and to the cathode track 14 by means of a cathode interconnect 13. The arrangement and orientation of anode track 12 and cathode track 14 is only exemplary and may be adapted according to the particular electrical and mechanical boundary conditions.

Figure 2:
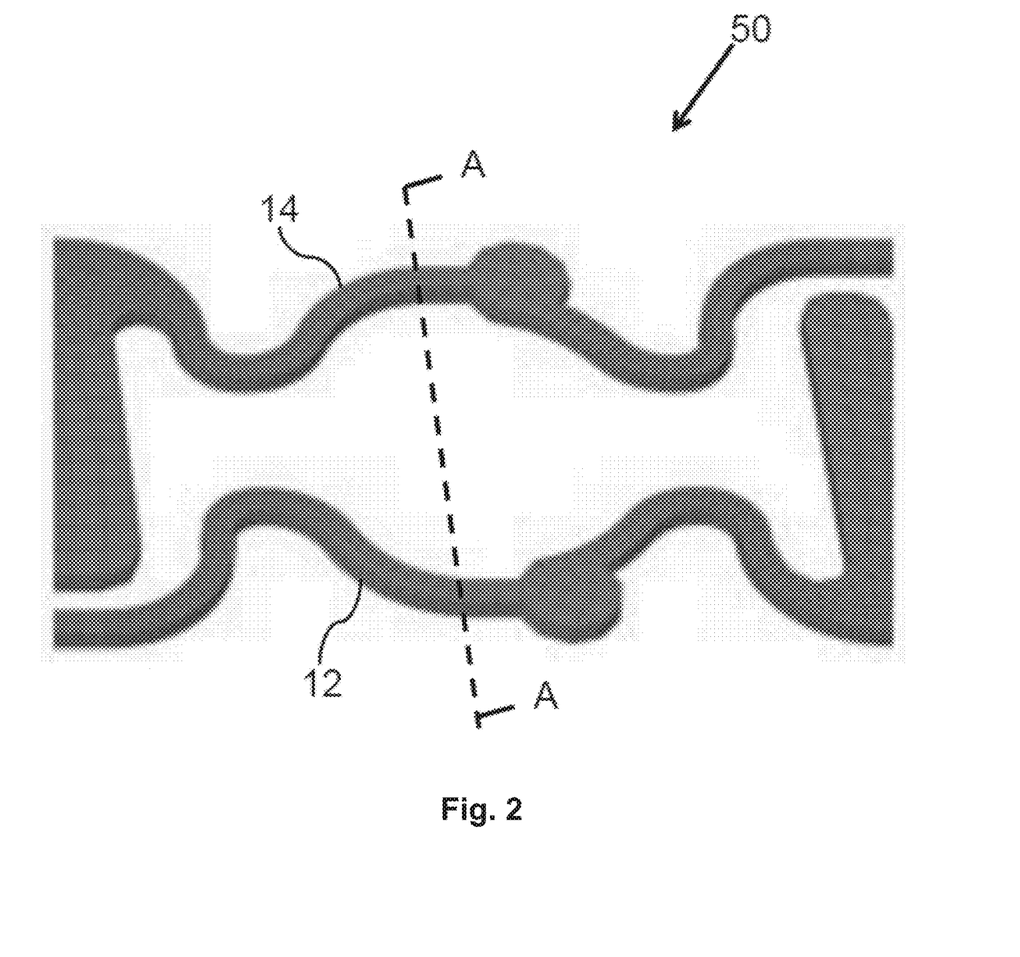
FIG. 2 shows a magnification of a coupling area of the lighting strip

FIG. 2 shows a magnification of the coupling area 50 of such a lighting strip. The magnification shows anode track 12 and cathode track 14 each comprising a spring structure (meandering shape of the anode track 12 and cathode track 14) supporting flexibility of the lighting strip. The magnification further shows line A-A which is further discussed with respect to FIG. 3.

Figure 3:
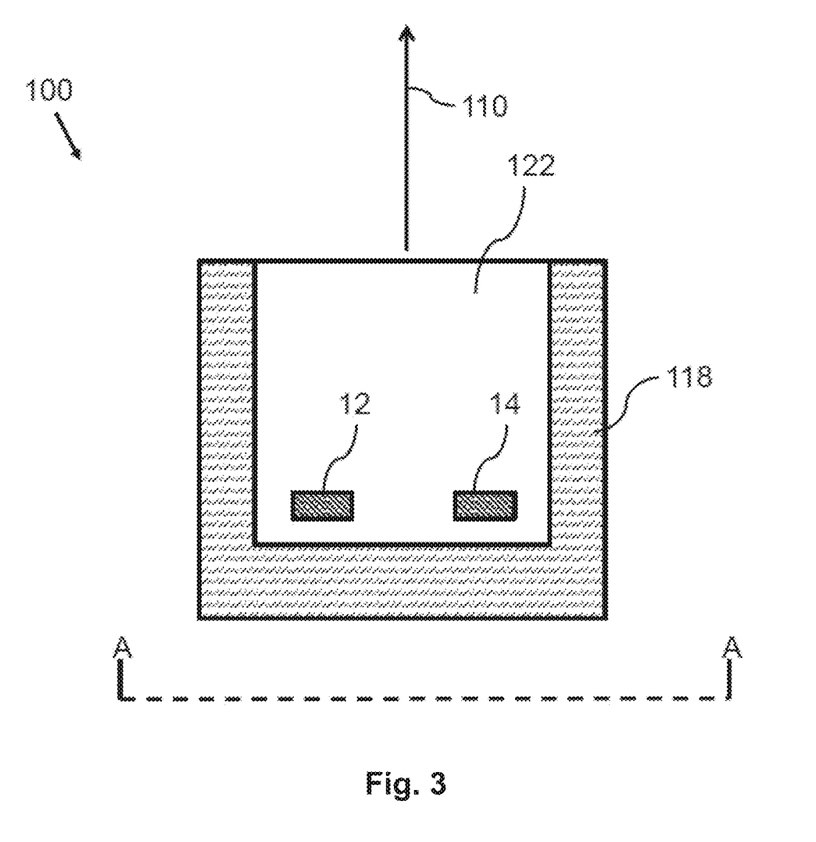
FIG. 3 shows a principal sketch of a cross-section through a lighting strip

FIG. 3 shows a principal sketch of a cross-section along line A-A through a lighting strip in accordance with FIG. 1 and FIG. 2 further comprising a frame structure 118 and a light guiding structure 122 which is bordered by the non-transparent frame structure 118. The frame structure 118 is arranged such that emitted light 110 can be emitted via one surface of the light guiding structure 122. The light guiding structure 122 comprises a flexible silicone polymer embedding the LEDs 22 and the electrical connections. The cross-section along line A-A further shows anode track 12 and cathode track 14.

Figure 5:
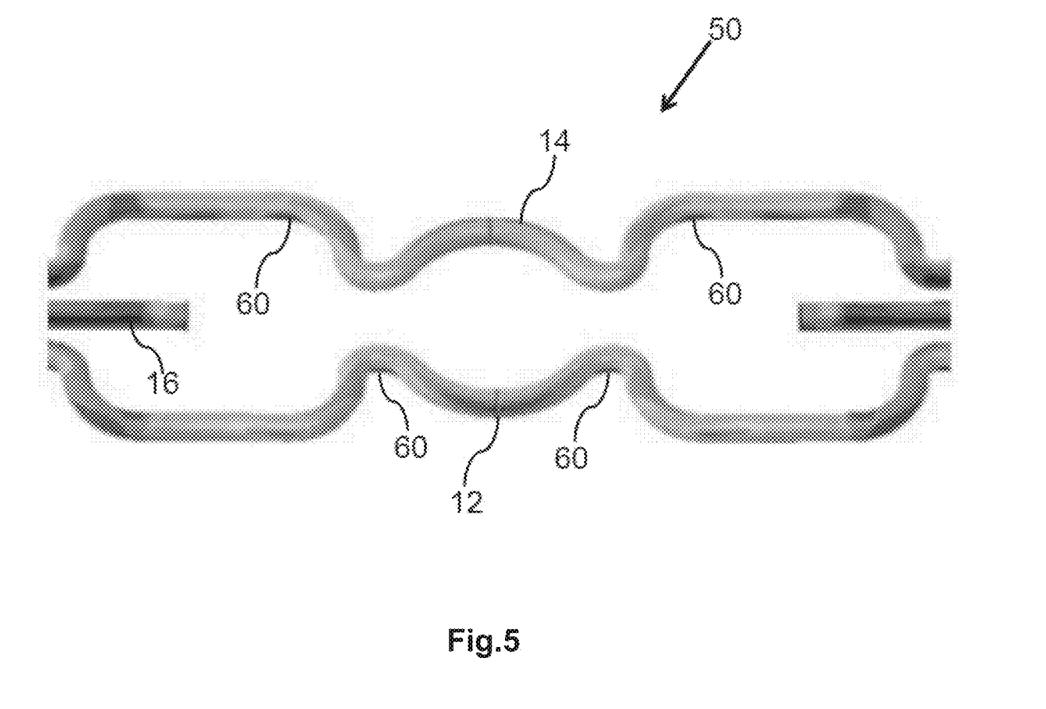
FIG. 5 shows simulation results of the coupling area of a lighting strip

FIG. 5 shows thermo-mechanical simulation results of the coupling area 50 of a lighting strip described with respect to FIGS. 1-4. A lead frame comprises anode track 12, cathode track 14 and series connection 16 which are modeled as wires with round cross-section. The diameter of each wire is 0.5 mm. The anode track 12, cathode track 14 and series connection 16 are embedded in the light guiding structure 122 (not shown) and a frame structure 118 (not shown) as discussed with respect to FIG. 3. The material properties which are used for the FEM simulation are given in table 1:

TABLE 1

Mechanical properties used for modeling of thermal deformation

| Component | Material | E (MPa) | CTE (ppm/° C.) | Yield stress (MPa) | Hardening (MPa) |
| --- | --- | --- | --- | --- | --- |
| Frame structure | Silicone filled with inorganic particles | 2.5 | 250 | | |
| Light guiding structure | Silicone | 0.9 | 300 | | |
| Lead frame | Cu alloy | 130.000 | 17.6 | 240 | 404 |

The missing series connection 16 between neighboring groups of LEDs 22 causes a nonuniform stiffness of the coupling area 50 in comparison to neighboring groups of LEDs 22 which are indicated by series connection 16. This results in high stress zones 60 with maximal Von Mises stress in and around the coupling area 50 of 100 MPa.

Figure 6:
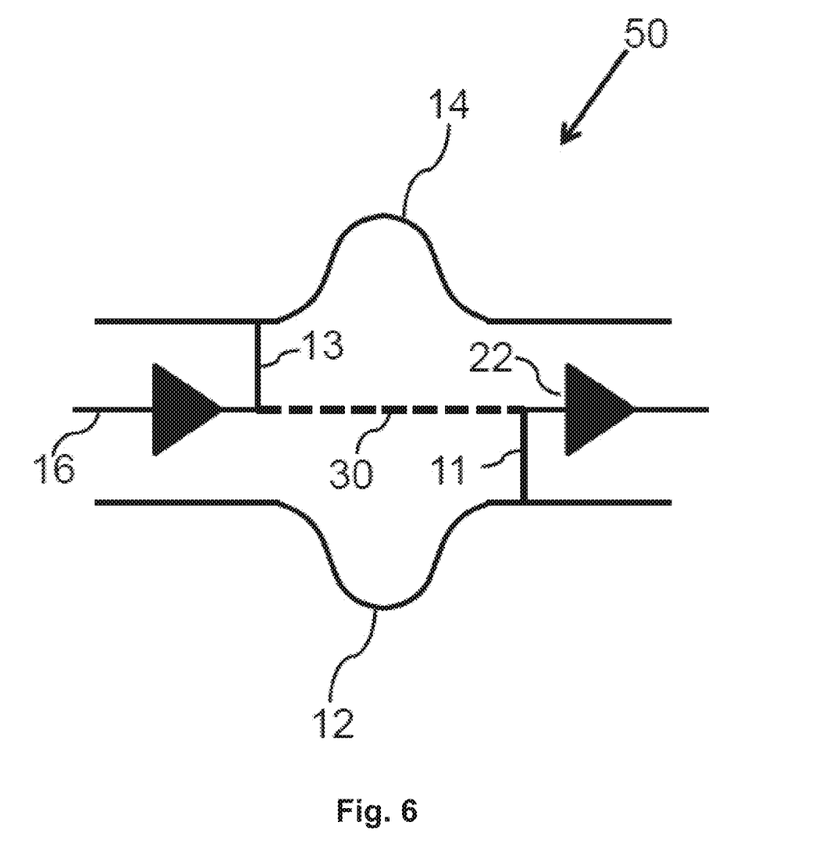
FIG. 6 shows a principal sketch of a first embodiment of a flexible lighting strip

FIG. 6 shows a principal sketch of a first embodiment of a flexible lighting strip 100. Two groups of LEDs 22 which are arranged in an electrical series connection 16 are mechanically coupled in the coupling area 50 by means of a local coupling structure 30. The coupling structure 30 comprises in this embodiment an electrically isolating material to avoid a short circuit between the anode track 12 and the cathode track 14. The additional stiffness of the coupling area 50 which is provided by means of the coupling structure 30 enables a homogeneous bending of the flexible lighting strip 100. It can be shown by means of similar simulations as discussed with respect to FIG. 5 (same structure but with coupling structure 30 in the coupling area) that the maximal Von Mises stress in the coupling area 50 can be reduced from 100 MPa to 70 MPa. Furthermore, plastic deformation could be lowered and better distributed between the neighboring groups of LEDs 22.

Figure 7:
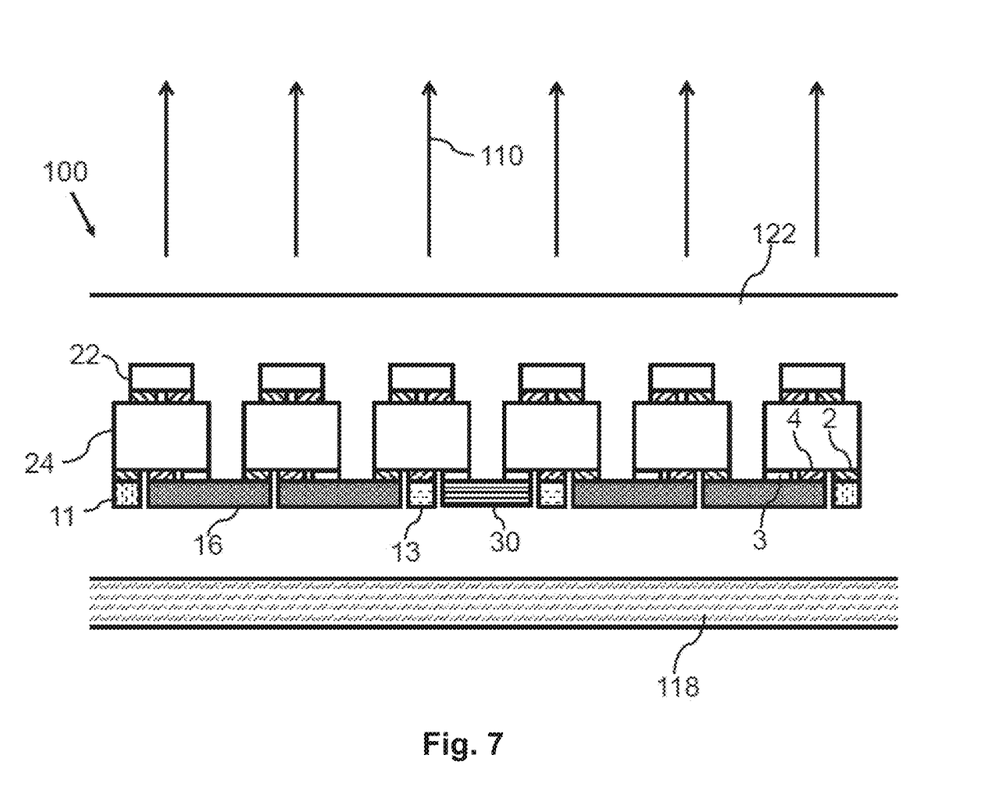
FIG. 7 shows a longitudinal cross-section of a second embodiment of the flexible lighting strip

FIG. 7 shows a longitudinal cross-section of a second embodiment of a flexible lighting strip 100 which comprises a multitude of groups of LEDs 22 in series connection 16 wherein the group of LEDs 22 are mechanically coupled by means of an electrically conductive coupling structure 30 which is electrically isolated with respect to the anode interconnect 11, the anode track 12, the cathode interconnect 13 and the cathode track 14. The coupling structure 30 consists of the same material as the electrical series connection 16. Each LED 22 is soldered on an interposer 24. Each interposer 24 comprises an anode contact 2, a cathode contact 4 and a coupling pad 3. The anode contact 2 and the cathode contact 4 are arranged to enable the series connection 16 by connecting the anode contact 2 of a first interposer 24 with the cathode contact 4 of a second interposer 24 which is arranged next to the first interposer 24. The anode contact 2 and the cathode contact 4 are further arranged to enable parallel connection of groups of the LEDs 22 by means of anode interconnect 11 and cathode interconnect 13 as shown in FIG. 4 and especially FIG. 6. The coupling structure 30 is in this embodiment a metal wire soldered to the coupling pads 3 of the last LED 22 of the first group of LEDs 22 and the first LED 22 of the second group of LEDs 22 which is arranged next to the first group of LEDs 22. The same metal wire is used for the series connection 16 such that mechanical properties of the flexible lighting strip 100 (especially the stiffness) between two neighboring LEDs 22 of one group of LEDs 22 and between two neighboring LEDs 22 of the different groups of LEDs 22 are essentially the same. The flexible lighting strip 100 further comprises a light guiding structure 122 in which the LEDs 22, interposers 24, anode track 12, cathode track 14, series connection 16 and coupling structure 30 are embedded. The light guiding structure 122 is bordered (similar as discussed with respect to FIG. 3) by means of a frame structure 118 such that emitted light 110 can leave the flexible lighting strip 100 via one surface of the in this embodiment a rectangular light guiding structure 122. The flexible lighting strip 100 may alternatively be characterized by a circular, elliptical, triangular etc. cross-section perpendicular to the longitudinal extension of the flexible lighting strip.

Figure 8:
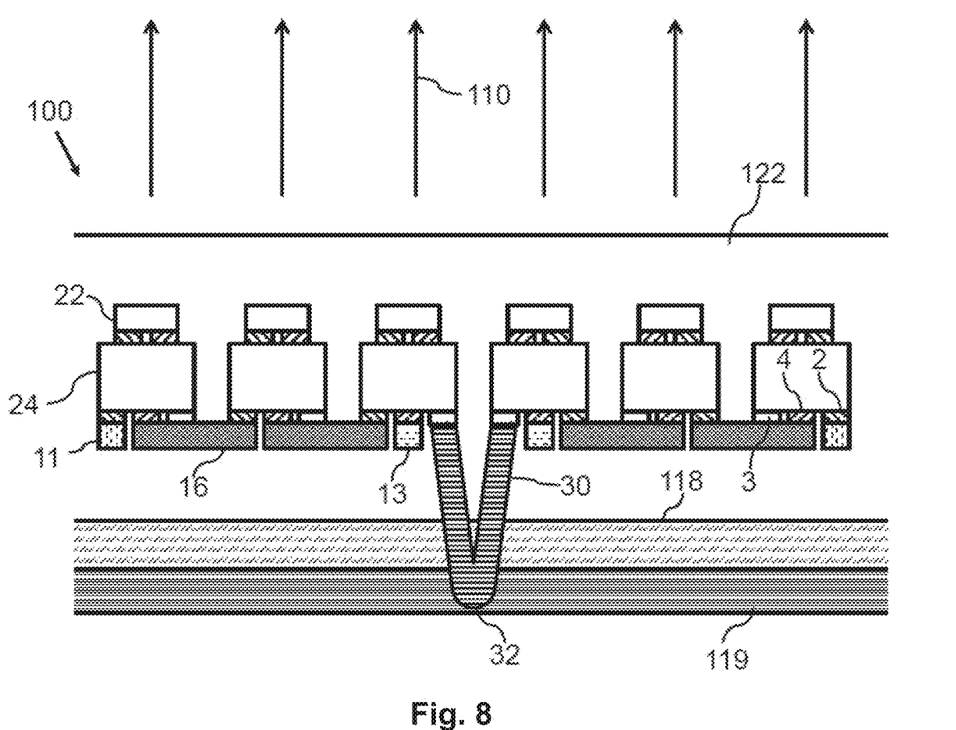
FIG. 8 shows a longitudinal cross-section of a third embodiment of the flexible lighting strip

FIG. 8 shows a longitudinal cross-section of a third embodiment of the flexible lighting strip 100. The general configuration is very similar as discussed with respect to FIG. 7. The main difference is that the coupling structure 30 is not straight as described with respect to FIG. 7 but V-shaped in the plane of FIG. 8. The coupling structure 30 extends through the frame structure 118 and is coupled to a heat distribution structure 119 by means of a coupling interface 32. For better heat transfer from LEDs 20 to the heat dissipation structure 119, several coupling structures 30 extending through the frame structure 118 may be used.

The heat distribution structure 119 may, for example, be a metal foil or graphite foil attached to the outer surface or one of the surfaces of the frame structure. The coupling structure 30 may enable an efficient cooling of the flexible lighting strip 100 without, for example, the need of transparent or translucent material comprised by the light guiding structure 122 with higher thermal conductivity in comparison to, for example, a low-cost silicone polymer. Furthermore, elaborative heat spreading of the heat generated in the single LED 22 may be avoided.

Figure 9:
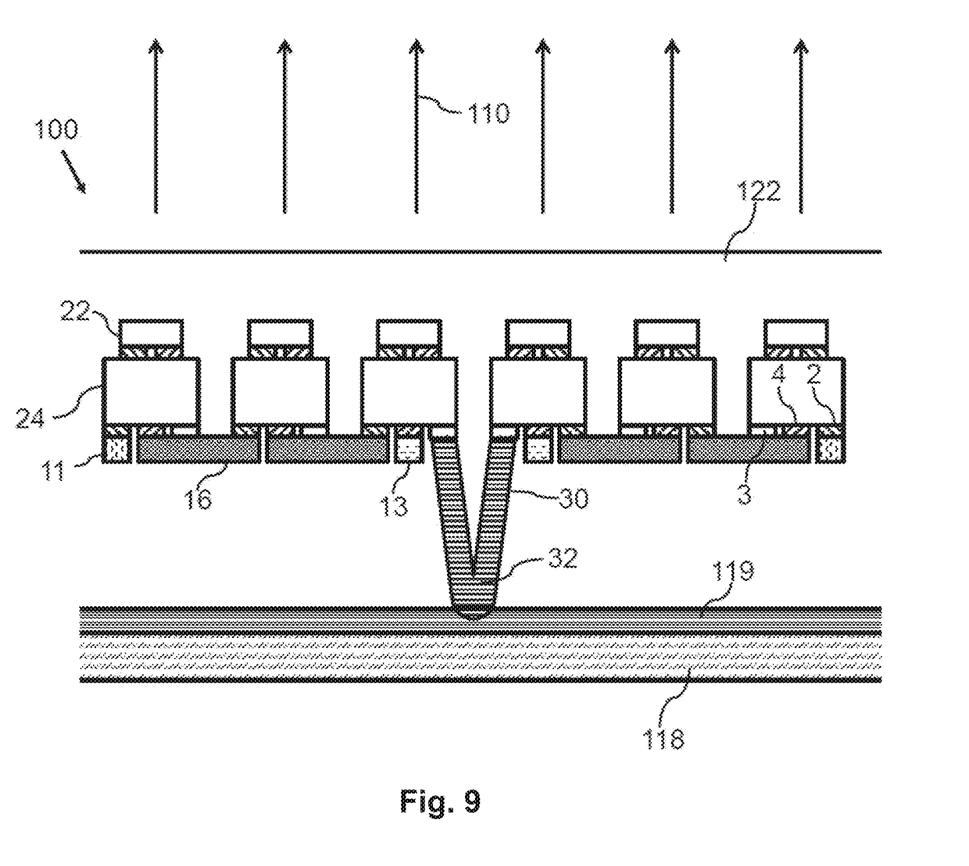
FIG. 9 shows a longitudinal cross-section of a fourth embodiment of the flexible lighting strip

FIG. 9 shows a longitudinal cross-section of a fourth embodiment of the flexible lighting strip 100. The general configuration is very similar as discussed with respect to FIG. 8. The heat distribution structure 119 is in contrast to the embodiment discussed with respect to FIG. 8 attached to an inner surface of the frame structure 118.

Figure 10:
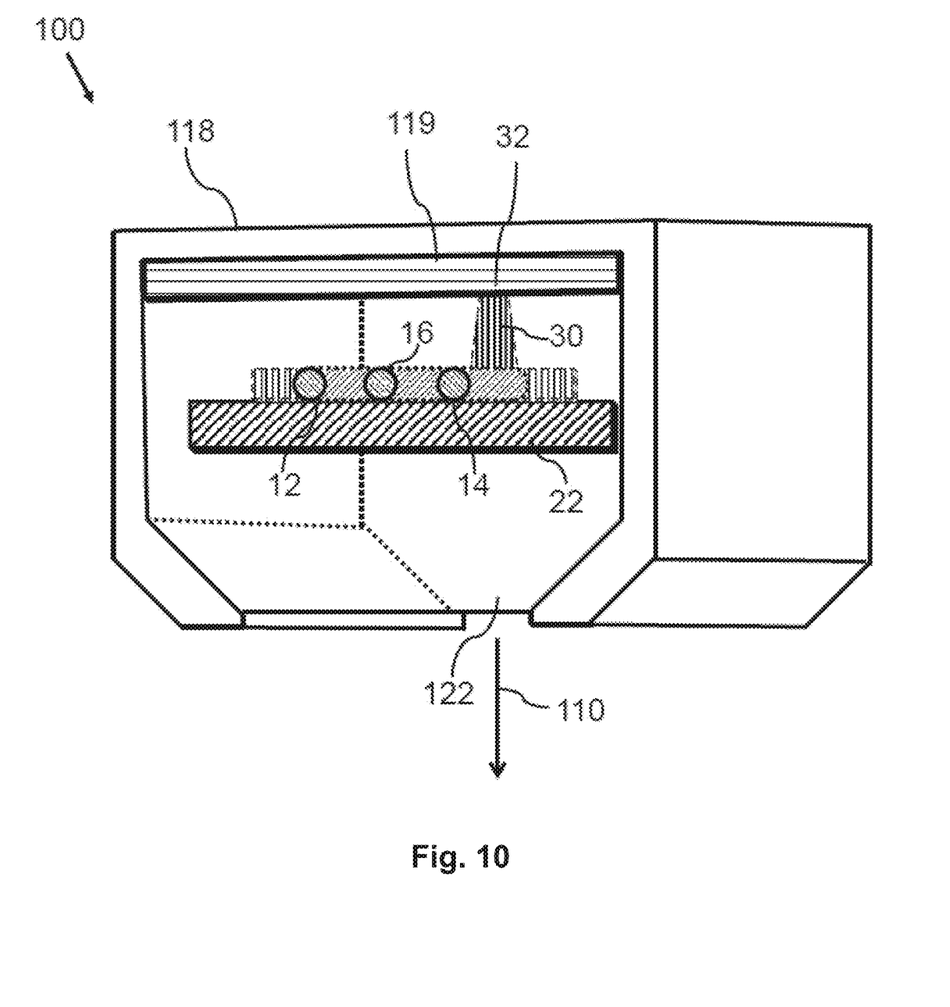
FIG. 10 shows a cross-section of a fifth embodiment of the flexible lighting strip

FIG. 10 shows a perspective view of cross-section of a fifth embodiment of the flexible lighting strip 100. The flexible lighting strip 100 comprises in this embodiment no interposers 24. The LEDs 22 comprised by a group of LEDs 22 are arranged in an electrical series connection 16. Neighboring groups of LEDs 22 are mechanically coupled by means of coupling structure 30 which consists of a material with a relative high thermal conductivity (e.g. copper). The coupling structure 30 is mechanically and thermally coupled by means of coupling interface 32 to heat distribution structure 119. The heat distribution structure comprises a metal foil attached to a polymer foil which is glued to one inner surface of a frame structure 118 similar as discussed with respect to FIG. 9. The frame structure 118 may comprise a flexible, nontransparent plastic material. The frame structure 118 borders a light guiding structure 112 such that there is one light emission surface through which emitted light 110 can be emitted during operation of the flexible lighting strip 100. The light guiding structure 112 comprises molded silicone polymer embedding the LEDs 22, the anode track 12, the cathode track 14 and the series connection 16 within the hollow section of the frame structure 118. The coupling interface 32 of the coupling structure 30 extends out of the silicon polymer to enable good thermal coupling to the heat distribution structure 119. The heat distribution structure 119 is further used to exchange digital data with the respective LED 22 via the coupling structure 30.

Figure 11:
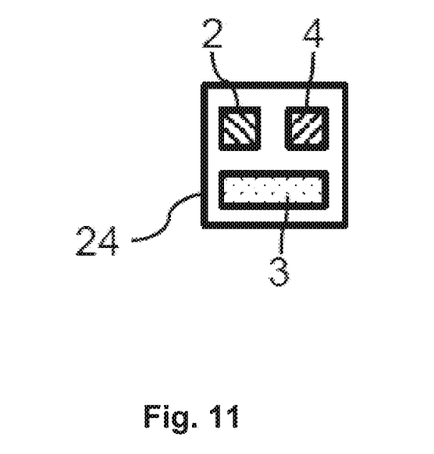
Figure 12:
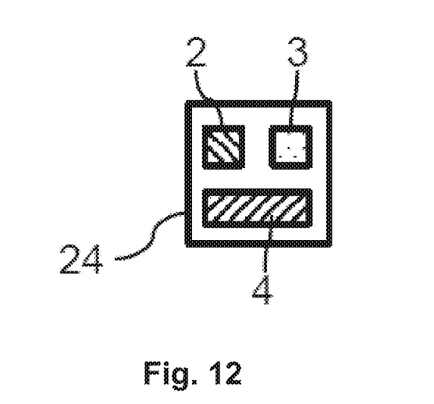
Figure 13:
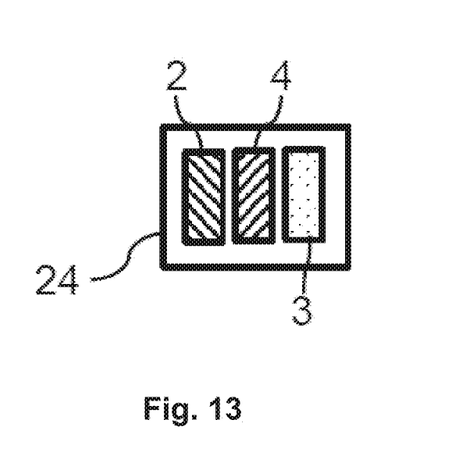

FIGS. 11-13 show different embodiments of interposers 24 which may be used in a flexible lighting strip 100. Each interposer 24 comprises an anode contact 2, a coupling pad 3 and a cathode contact 4. The interposers 24 may have any suitable geometric shape. The anode contact 2, the coupling pad 3 and the cathode contact 4 are distributed in accordance with the respective mechanical and electrical boundary conditions. The different configurations of the arrangement of the anode contact 2, the coupling pad 3 and the cathode contact 4 shown in FIGS. 11-13 indicate that the series connection 16 and/or the coupling structure 30 is not necessarily arranged between the anode track 12 and the cathode track 14 as discussed with respect to FIGS. 6-10. The anode track 12 may, for example, be arranged between the cathode track 14 and the coupling structure 30 (or vice versa).

While the invention has been illustrated and described in detail in the drawings and the foregoing description, such illustration and description are to be considered illustrative or exemplary and not restrictive.

From reading the present disclosure, other modifications will be apparent to persons skilled in the art. Such modifications may involve other features which are already known in the art and which may be used instead of or in addition to features already described herein.

Variations to the disclosed embodiments can be understood and effected by those skilled in the art, from a study of the drawings, the disclosure and the appended claims. In the claims, the word "comprising" does not exclude other elements or steps, and the indefinite article "a" or "an" does not exclude a plurality of elements or steps. The mere fact that certain measures are recited in mutually different dependent claims does not indicate that a combination of these measures cannot be used to advantage.

Any reference signs in the claims should not be construed as limiting the scope thereof.

REFERENCE SIGNS 2 anode contact
3 coupling pad
4 cathode contact
11 anode interconnect
12 anode track
13 cathode interconnect
14 cathode track
16 series connection
22 light-emitting diode (LED)
24 interposer
30 coupling structure
32 coupling interface
50 coupling area
60 high stress zones
100 flexible lighting strip
110 emitted light
118 frame structure
119 heat distribution structure
122 light guiding structure

What is claimed is:

1. A flexible lighting strip comprising:
a plurality of light-emitting diodes arranged in at least two groups, the at least two groups being arranged in a parallel electrical connection with a last light-emitting diode of a first group next to a first light-emitting diode of a second group; and
an electrically isolated coupling structure mechanically coupling the last light-emitting diode of the first group to the first light-emitting diode of the second group, the coupling structure arranged between the first group and the second group so that the stiffness of the flexible lighting strip between the at least two groups matches the stifness of the flexible lighting strip within the at least two groups, the coupling structure allowing bending around at least two linear independent axes.

2. The flexible lighting strip according to claim 1, wherein the coupling structure is arranged such that the stiffness of the flexible lighting strip between the last light-emitting diode of the first group and the first light-emitting diode of the second group is at least equal to a stiffness between two neighboring light-emitting diodes of the groups of LEDs which are arranged in the electrical series connection.

3. The flexible lighting strip according to claim 1, wherein the coupling structure comprises a material with a Young's modulus greater than 1 GPa, preferably greater than 10 GPa.

4. The flexible lighting strip according to claim 1, wherein the light-emitting diodes are embedded in a translucent material.

5. The flexible lighting strip according to claim 4, wherein the translucent material is comprised by a light guiding structure, and wherein the light guiding structure is framed by a frame structure such that emitted light emitted by the light-emitting diodes during operation of the flexible lighting strip leaves the light guiding structure via an opening of the frame structure.

6. The flexible lighting strip according to claim 5, wherein the coupling structure comprises a coupling interface, wherein the coupling interface is coupled to a heat distribution structure.

7. The flexible lighting strip according to claim 6, wherein the coupling interface is arranged to provide a data connection to the last light-emitting diode of the first group or the first light-emitting diode of the second group.

8. A vehicle light assembly comprising the flexible lighting strip according to claim 1, wherein the vehicle light assembly comprises an electrical interface, wherein the electrical interface is arranged to couple the vehicle light assembly to an external power supply.

9. A vehicle rear light or vehicle front light, wherein the vehicle rear light or the vehicle front light comprises the vehicle light assembly in accordance with claim 8.

10. The flexible lighting strip according to claim 1 further including an anode track and a cathode track connected to the at least two groups.

11. The flexible lighting strip according to claim 10, wherein a mechanical coupling between the coupling structure and the anode track and between the coupling structure and the cathode track is dominated by a mechanical coupling of the coupling structure to the last light-emitting diode of the first group and the first light-emitting diode of the second group.

12. The flexible lighting strip according to claim 10, wherein the anode track, the cathode track and the coupling structure are arranged such that a relative movement between the anode track, the cathode track and the coupling structure is enabled.

13. The flexible lighting strip according to claim 10, wherein the anode track and the cathode track are symmetrically arranged with respect to the coupling structure along a longitudinal extension of the coupling structure.

14. The flexible lighting strip according to claim 10, wherein the coupling structure comprises substantially the same type of material as an electrical connection between two neighboring light-emitting diodes, the coupling structure electrically isolated with respect to the anode track and the cathode track.

15. The flexible lighting strip according to claim 10, wherein each light-emitting diode is attached to a single interposer, wherein the interposer comprises an anode contact, a cathode contact and a coupling pad, wherein the coupling pad is electrically isolated with respect to the anode contact and the cathode contact, wherein one anode contact of each group of light-emitting diodes is electrically connected to the anode track, wherein one cathode contact of each group light-emitting diodes is electrically connected to the cathode track, and wherein the coupling structure is bonded to the coupling pad of the interposer attached to the last light-emitting diode of the first group and to the coupling pad of the interposer attached to the first light-emitting diode of the second group.

16. The flexible lighting strip according to claim 15, wherein one anode contact of each group of light-emitting diodes is electrically connected to the anode track by means of an anode interconnect, wherein one cathode contact of each group light-emitting diodes is electrically connected to the cathode track by means of a cathode interconnect.

\* \* \* \* \*